US008920676B2

(12) United States Patent
Cheetham et al.

(10) Patent No.: US 8,920,676 B2
(45) Date of Patent: Dec. 30, 2014

(54) CERIUM BASED PHOSPHOR MATERIALS FOR SOLID-STATE LIGHTING APPLICATIONS

(75) Inventors: Anthony K. Cheetham, Santa Barbara, CA (US); Ronan P. Le Toquin, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 1389 days.

(21) Appl. No.: 11/541,708

(22) Filed: Oct. 2, 2006

(65) Prior Publication Data

US 2007/0159066 A1 Jul. 12, 2007

Related U.S. Application Data

(60) Provisional application No. 60/722,900, filed on Sep. 30, 2005, provisional application No. 60/722,682, filed on Sep. 30, 2005.

(51) Int. Cl.

| | | |
|---|---|---|
| *C09K 11/08* | (2006.01) | |
| *C09K 11/66* | (2006.01) | |
| *H01J 1/52* | (2006.01) | |
| *H01J 19/40* | (2006.01) | |
| *C09K 11/77* | (2006.01) | |
| *H01L 33/50* | (2010.01) | |
| *H05B 33/14* | (2006.01) | |

(52) U.S. Cl.
CPC ......... *C09K 11/7721* (2013.01); *C09K 11/0883* (2013.01); *H01L 33/502* (2013.01); *Y02B 20/181* (2013.01); *H05B 33/14* (2013.01)
USPC .................................... 252/301.4 F; 313/503

(58) Field of Classification Search
USPC ..................................... 252/301.4 F; 313/503
See application file for complete search history.

(56) References Cited

U.S. PATENT DOCUMENTS

| | | | |
|---|---|---|---|
| 2,308,736 A | | 1/1943 | Ascherman |
| 2,542,349 A | * | 2/1951 | Ouweltjes ............... 252/301.4 F |

(Continued)

FOREIGN PATENT DOCUMENTS

| | | |
|---|---|---|
| CN | 1268250 | 9/2000 |
| EP | 0936682 | 8/1999 |

(Continued)

OTHER PUBLICATIONS

Spijker. Lu2S3:Ce3+, A new red luminescing scintillator.Nuclear Instruments and Methods in Physics Research Section B: Beam Interactions with Materials and Atoms vol. 134, Issue 2, Feb. 1, 1998, pp. 304-309.*

(Continued)

*Primary Examiner* — Matthew E Hoban
(74) *Attorney, Agent, or Firm* — Gates & Cooper LLP

(57) ABSTRACT

A luminescent cerium (Ce) doped compound emitting bright red light, comprising a calcium silicate nitride ternary system, such as $CaSiN_{2-\delta}O_\delta:Ce^{3+}$, that crystallizes in a face-centered cubic unit cell with a lattice parameter of $\sim a=14.88$ Å. The Ce doped compound can be used for white light applications either: (i) to enhance the light quality of the system based on a blue LED with a yellow or green phosphor, (ii) as an orange phosphor in combination with a blue LED and a green phosphor, or (iii) as a red phosphor in a setup comprising a ultraviolet (UV) LED and red, green and blue (RGB) phosphors. Substitution of smaller elements on the Ca site or larger elements on the Si site leads to a decrease of the emission wavelength towards the yellow or orange region.

27 Claims, 7 Drawing Sheets

(56) References Cited

U.S. PATENT DOCUMENTS

| | | | |
|---|---|---|---|
| 2,835,636 A * | 5/1958 | Rimbach | 252/301.4 P |
| 3,014,877 A | 12/1961 | Ranby et al. | |
| 3,360,674 A | 12/1967 | Felix et al. | |
| 5,030,600 A | 7/1991 | Hida et al. | |
| 5,063,183 A | 11/1991 | Taniguchi et al. | |
| 5,998,925 A | 12/1999 | Shimizu et al. | |
| 6,084,250 A | 7/2000 | Justel et al. | |
| 6,155,699 A | 12/2000 | Miller et al. | |
| 6,252,254 B1 | 6/2001 | Soules et al. | |
| 6,278,135 B1 | 8/2001 | Srivastava et al. | |
| 6,357,889 B1 | 3/2002 | Duggal et al. | |
| 6,521,915 B2 | 2/2003 | Odaki et al. | |
| 6,544,437 B2 | 4/2003 | Park et al. | |
| 6,558,574 B2 | 5/2003 | Cwak et al. | |
| 6,608,332 B2 | 8/2003 | Shimizu et al. | |
| 6,657,379 B2 | 12/2003 | Ellens et al. | |
| 6,670,748 B2 | 12/2003 | Ellens et al. | |
| 6,682,663 B2 | 1/2004 | Botty et al. | |
| 6,717,349 B2 | 4/2004 | Wang et al. | |
| 6,717,353 B1 | 4/2004 | Mueller et al. | |
| 6,746,295 B2 | 6/2004 | Sorg | |
| 6,809,781 B2 | 10/2004 | Setlur et al. | |
| 6,869,753 B2 | 3/2005 | Chua et al. | |
| 7,018,345 B2 | 3/2006 | Mori et al. | |
| 7,026,755 B2 | 4/2006 | Setlur et al. | |
| 7,045,826 B2 | 5/2006 | Kim et al. | |
| 7,077,979 B2 | 7/2006 | Cheetham et al. | |
| 7,220,369 B2 | 5/2007 | Cheetham et al. | |
| 7,252,788 B2 | 8/2007 | Nagatomi et al. | |
| 7,332,106 B2 | 2/2008 | Yoshino et al. | |
| 2001/0001207 A1 | 5/2001 | Shimizu et al. | |
| 2003/0006702 A1 | 1/2003 | Mueller-Mach et al. | |
| 2003/0052595 A1 | 3/2003 | Ellens et al. | |
| 2004/0211970 A1 | 10/2004 | Hayashimoto et al. | |
| 2005/0156510 A1 | 7/2005 | Chua et al. | |
| 2005/0189863 A1 | 9/2005 | Nagatomi et al. | |
| 2005/0212397 A1 | 9/2005 | Murazaki et al. | |
| 2005/0242329 A1 | 11/2005 | Fiedler et al. | |
| 2006/0006782 A1 | 1/2006 | Nagatomi et al. | |
| 2006/0033083 A1 | 2/2006 | Sakane et al. | |
| 2007/0007494 A1 | 1/2007 | Hirosaki et al. | |
| 2007/0075629 A1 | 4/2007 | Le Toquin et al. | |
| 2007/0159066 A1 | 7/2007 | Cheetham et al. | |
| 2007/0159091 A1 | 7/2007 | Hirosaki et al. | |
| 2007/0241666 A1 | 10/2007 | Jang et al. | |
| 2008/0054793 A1 * | 3/2008 | Yang et al. | 313/503 |
| 2009/0212314 A1 | 8/2009 | Im et al. | |
| 2009/0236969 A1 | 9/2009 | Hirosaki | |
| 2011/0053299 A1 | 3/2011 | Shimieu et al. | |
| 2011/0062864 A1 | 3/2011 | Shimizu et al. | |
| 2011/0297990 A1 | 12/2011 | Shimizu et al. | |

FOREIGN PATENT DOCUMENTS

| | | |
|---|---|---|
| EP | 1081771 A2 | 3/2001 |
| EP | 1296376 | 3/2003 |
| EP | 1296383 | 3/2003 |
| EP | 1616930 A2 | 1/2006 |
| EP | 1696016 | 8/2006 |
| JP | 10-242513 | 9/1998 |
| JP | 1998-242513 A | 9/1998 |
| JP | 2002-226846 | 8/2002 |
| JP | 2003-206481 A | 7/2003 |
| JP | 2004115659 A | 4/2004 |
| JP | 2005235934 A | 9/2005 |
| JP | 2005239985 A | 9/2005 |
| JP | 2005-336253 A | 12/2005 |
| JP | 2005-228833 | 10/2012 |
| TW | 200527697 | 8/2005 |
| TW | 200530374 | 9/2005 |
| TW | 200643151 | 3/2006 |
| WO | 98/05078 | 2/1998 |
| WO | 2005/049763 | 6/2005 |
| WO | 2005/052087 | 6/2005 |
| WO | 2005/061659 | 7/2005 |
| WO | 2005/078811 | 8/2005 |
| WO | 2005/083037 | 9/2005 |
| WO | 2005083037 A1 | 9/2005 |
| WO | 2006/081803 | 8/2006 |
| WO | 2007-018260 A1 | 2/2007 |
| WO | 2007/018345 | 2/2007 |

OTHER PUBLICATIONS

Li. Luminescence properties of Ce3+-activated alkaline earth silicon nitride M2Si5N8 (M=Ca, Sr, Ba) materials. Journal of Luminescence vol. 116, Issues 1-2, Jan.-Feb. 2006, pp. 107-116.*

Dorenbos. Light output and energy resolution of Ce3+-doped scintillators. Nuclear Instruments and Methods in Physics Research Section A: Accelerators, Spectrometers, Detectors and Associated Equipment vol. 486, Issues 1-2, Jun. 21, 2002, pp. 208-213.*

Bondar. Synethsis, Structure, and Luminescence of A2B4C5 nitrides. Mat. Res. Soc. Symp. Proc. vol. 639. 2001.*

Van Kravel, J.W.H. et al., Long wavelength Ce3+ emission in Y—Si—O—N materials, Journal of Alloys and Compounds, 1998, 268 (1-2): 272-277.

Van Kravel, J.W.H. et al., Luminescence Properties of Terbium-, Cerium-, or Europium-Doped x-Sialon Materials, Journal of Solid State Chemistry, 2002, 165 (1): 19-24.

Gal, Z.A. et al., Synthesis and Structure of Alkaline Earth Silicon Nitrides: BaSiN2, SrSiN2, and CaSiN2, Inorganic Chemistry, 2004, 43: 3998-4006.

Blasse, G. et al., A New Phosphor for Flying-Spot Cathode-Ray Tubes for Color Television: Yellow-Emitting Y3Al5O12-Ce3+, Applied Physics Letters, 1967, 5139.

Nakamura, S. et al., The Blue Laser Diode: The Complete Story, Springer, 1997, Berlin, 328.

Blasse, G. et al., Investigation of Some Ce2+-Activated Phosphors: Journal of Chemical Physics, 1967, 5139.

Denbaars, S.P., "Light emitting diodes: materials growth and properties," Solid State Luminescence Theory, Materials and Devices, 1993, pp. 263-291, edited by A.H. Kitai, Chapman and Hall, London.

Justel, T. et al., "New Developments in the Field of Luminescent Materials for Lighting and Displays," Angew. Chem. Int. Ed., 1998, pp. 3084-3103, vol. 37.

Lee, S.S. et al., "Photoluminescence and Electroluminescence Characteristics of CaSiN2: Eu Phosphor," Proc. SPIE Int. Soc. Opt. Eng., 1997, pp. 75-79, vol. 3241.

Pugar, E.A., et al., "New Cubic Structure in the Ca—Si—O—N System," J. Am. Ceram. Soc., 1988, pp. C-288-C-291, vol. 71, No. 6.

International Search Report mailed Nov. 1, 2007.

Van Kravel et al.; "Luminescence Properties of Terbium-, Cerium-, or Europium-Doped α-Sialon Materials". Journal of Solid State Chemistry 165; pp. 19-24 (2002).

Xie et al.; "Photoluminescence of Cerium-Doped α-SiAlON Materials". J. Am. Ceram. Soc, 87 [7]; pp. 1368-1370 (2004).

Xie et al.; "Photoluminescence of Rare-Earth-Doped Ca-α-SiAlON Phosphors: Composition and Concentration Dependence". J. Am. Ceram. Soc., 88[10]; pp. 2883-2888 (2005).

Chapter 11: "Luminescence properties of rare earth doped α-SiAlON materials". pp. 145-157; Jan. 1, 2000.

Supplementary European Search Report for EP Application No. 06825385.5 filed on Oct. 2, 2006.

Drofenik, M. et al., "Refinement of the Sr2EuFeO5 and SrEuAlO5 structures," Acta Cryst., B35, 1979, pp. 1059-1062.

Glasser, L. et al., "Silicates M3SiO5 I. Sr3SiO5," Acta Cryst., 18, 1965, pp. 453-454.

Greenham, N. "Measurement of absolute photoluminescence quantum efficiencies in conjugated polymers," Chemical Physics Letters, 241, Jul. 14, 1995, pp. 89-96.

Huang, Z. et al., "Phase relations of the Si3N4—AlN—CaO system," Journal of Materials Science Letters, vol. 4, No. 3, 1985, pp. 255-259.

Im, W. et al., "A yellow-emitting Ce3+ phosphor, La1-xCexSr2AlO5, for white-emitting diodes," Applied Physics Letters, 93, 2008, pp. 091905-1-091905-3.

(56) References Cited

OTHER PUBLICATIONS

Im, W. et al. "La1-x-0.025Ce0.025Sr2+xAl1-xSixO5 solid solutions as tunable yellow phosphors for solid state white lighting," J. Mater. Chem. 19, 2009, pp. 1325-1330.

Park, J. et al., "Embodiment of the warm white-light-emitting diodes by using a Ba2+ codoped Sr3SiO5: Eu phosphor," Applied Physics Letters, 88, 2006, pp. 043511-1-043511-3.

Park, J. et al., "Investigation of strontium silicate yellow phosphors for white light emitting diodes from a combinatorial chemistry," Applied Physics Letters, 87, 2005, pp. 031108-1-031108-3.

Park, J. et al., "White light-emitting diodes of GaN-based Sr2SiO4: Eu and the luminescent properties," Applied Physics Letters, vol. 82, No. 5, Feb. 3, 2003, pp. 683-685.

Uheda, K. et al., "The crystal structure and photoluminescence properties of a new red phosphor, calcium aluminum silicon nitride doped with divalent europium," The Electrochemical Society, Inc., 2004, Proceedings of the 2004 Joint Research Meeting, ECS Oct. 2004, Y1-Thirteen International Symposium on the Physics and Chemistry of Luminescent Materials, Abstract 2073, 206th Meeting.

Uheda, K. et al., "X-ray absorption fine structure study of La doped a red phosphor SrIn2O4:Pr3+," The Electrochemical Society, Inc., 2004, Proceedings of the 2004 Joint Research Meeting, ECS Oct. 2004, Y1-Thirteen International Symposium on the Physics and Chemistry of Luminescent Materials, Abstract 2094, 206th Meeting.

Xie, R. et al., "Eu2+-doped Ca-a-SiAION: A yellow phosphor for white-light emitting diodes," Applied Physics Letters, vol. 84, No. 26, Jun. 28, 2004, pp. 5404-5406.

Yen, W. et al., Phosphor Handbook, Second Edition, 2007, pp. 185 and 490.

International Search Report, International application No. PCT/US06/38256, mailed Jul. 7, 2008.

Supplemental European Search Report, PCT/US2006/038256, dated Aug. 12, 2009.

European Office Action dated Apr. 18, 2012, Application No. 06825281.6.

Japanese Office Action dated Aug. 16, 2012 for JP application No. 2008-533772.

EPO Examination Communication dated Jul. 20, 2011 for EP Application No. 06825385.5.

Taiwanese Office Action (with English translation of Search Report) dated Oct. 26, 2012 for Taiwanese Patent Application No. 095136649.

EPO Communication dated Feb. 10, 2012 for European application No. 06825385.5 filed on Oct. 2, 2006.

Blasse, G., et al., "Fluorescence of Eu2+-Activated Ssilicates", Philips Res. Repts 23, 1968, pp. 189-200.

Blasse, G., et al., "Luminescent Materials", Springer-Verlag, Berlin (1994).

Kelsey, P. Victor, et al., "Ce3+-Activated Photoluminescence in the BaO—SrO—SiO2 System", I. Crystalline Phases, Journal of the Electrochemical Society, vol. 123, No. 9, Sep. 30, 1976, pp. 1384-1388.

Lakshminarasimhan, N., et al., "White Light Generation in Sr2SiO4:Eu2+, Ce3+ under Near-UV Excitation; A Novel Phosphor for Solid-State Lighting", Journal of the Electrochemical Society, 152 (9), H152-H156 (2005).

Li, Y. Q., et al., "Luminescence of a new class of UV-blue-emitting phosphors MSi2O2-δN2+⅔σ-:Ce3+(M=Ca, Sr, Ba)", Journal of Materials Chemistry, R. Soc. Chem. UK, vol. 15, No. 42, Sep. 7, 2005, pp. 4492-4496.

Nakamura, S., "The Blue Laser Diode: GaN Based Light Emitters and Lasers", Springer, Berlin (1997).

Orna, "The Chemical History of Color", Springer New York, 2013, p. 15.

Van Kravel, et al., "Luminescence properties of rare earth doped α-SiAlON materials", on New Rare-Earth Doped M—SiAl—O—N Materials, Jan. 1, 2000, pp. 145-157.

PCT International Search Report, International Application No. PCT/US06/38582, mailed on Feb. 12, 2008.

Supplemental European Search Report, International Application No. PCT/US06/38582, mailed on Feb. 18, 2010.

European Search Report dated Oct. 1, 2010 for European Application No. 10007184.4.

European Supplemental Search Report dated Oct. 29, 2010 for European Application No. 06825281.6.

European Office Action dated Aug. 4, 2011 for European Application No. 06825281.6.

European Office Action dated Aug. 4, 2011 for European Application No. 10007184.4.

Japanese Office Action for Japanese Patent Application No. 2008-533722 mailed on Aug. 15, 2012.

Taiwanese Office Action (with English translation) dated Nov. 8, 2012 for Taiwanese Patent Application No. 095136644.

Korean Office Action (with English translation) dated Dec. 13, 2012 for Korean Patent Application No. 10-2008-7010550.

Korean Office Action (with English translation) dated Dec. 13, 2012 for Korean Patent Application No. 10-2008-7010551.

\* cited by examiner

CERIUM BASED PHOSPHOR MATERIALS FOR SOLID-STATE LIGHTING APPLICATIONS

CROSS-REFERENCE TO RELATED APPLICATIONS

This application claims the benefit under 35 U.S.C. Section 119(e) of the following and commonly-assigned U.S. patent applications:

U.S. Provisional Application Ser. No. 60/722,900, filed on Sep. 30, 2005, by Anthony K. Cheetham and Ronan P. Le Toquin, entitled "CERIUM BASED PHOSPHOR MATERIALS FOR SOLID-STATE LIGHTING APPLICATIONS,"; and U.S. Provisional Patent Application Ser. No. 60/722,682, filed on Sep. 30, 2005, by Ronan P. Le Toquin and Anthony K. Cheetham, entitled "NITRIDE AND OXY-NITRIDE CERIUM BASED PHOSPHOR MATERIALS FOR SOLID-STATE LIGHTING APPLICATIONS,";

which applications are incorporated by reference herein.

This application is related to the following co-pending and commonly-assigned applications:

U.S. Utility patent application Ser. No. 11/541,755, filed on Oct. 2, 2006, by Ronan P. Le Toquin and Anthony K. Cheetham, entitled "NITRIDE AND OXY-NITRIDE CERIUM BASED PHOSPHOR MATERIALS FOR SOLID-STATE LIGHTING APPLICATIONS," which application claims priority to U.S. Provisional Patent Application Ser. No. 60/722,682, filed on Sep. 30, 2005, by Ronan P. Le Toquin and Anthony K. Cheetham, entitled "NITRIDE AND OXY-NITRIDE CERIUM BASED PHOSPHOR MATERIALS FOR SOLID-STATE LIGHTING APPLICATIONS,";

which applications are incorporated by reference herein.

BACKGROUND OF THE INVENTION

1. Field of the Invention.

The present invention relates to cerium (Ce) based phosphor materials for solid-state lighting applications.

2. Description of the Related Art.

(Note: This application references a number of different publications as indicated throughout the specification by one or more reference numbers within brackets, e.g., [x] A list of these different publications ordered according to these reference numbers can be found below in the section entitled "References." Each of these publications is incorporated by reference herein.)

Light emitting diodes (LEDs) based on wide band gap semiconductor materials such as GaN/InGaN produce ultraviolet (UV) and/or blue light (300 nm to 460 nm) with high efficiency and long lifetimes [1,15]. The emission from such LEDs can be converted into lower energy radiation using the luminescence properties of phosphor materials. A high intensity blue light (10) can be used to make white LED devices by combining a blue LED (11) and a yellow phosphor (12), so that blue and yellow light (13) is emitted, which appears as white light (14), as shown in FIG. 1(a). Alternatively, a mix of green and orange phosphor (15), as shown in FIG. 1(b), will emit blue, green and orange light (16) which appears as white light (14). Alternatively, a high intensity UV light (20) can be used to make white LED devices by combining a UV LED (21) and a blend of three red, green and blue (RGB) phosphors (22) which emit red, green and blue light (23) that appears as white light (24), as shown in FIG. 2. The LEDs (11) and (21), maybe formed on substrates (17) and (25), respectively.

The first commercially available white LED was based on an InGaN chip emitting blue photons at around 460 nm combined with a $Y_3Al_5O_{12}:Ce^{3+}$ (YAG) phosphor layer that converts blue photons into yellow photons [2,3]. As a result, a slightly bluish white light is produced that may, in principle, be improved by adding red photons from a second phosphor. In fact, red phosphors are necessary for the development of white LEDs regardless of the setup used and should be very bright in order to compensate the low red sensitivity of the human eye [4]. Bright red phosphors are, however, very difficult to achieve due to the quantum yield drop with increasing Stokes shift.

For $Ce^{3+}$ doped materials, UV emission is normally observed [5]. However, high crystal field symmetries (Ce-YAG [2]) or a strongly covalent Ce environment (sulfides or oxynitrides [6]) can decrease the energy of the emission wavelength. Yttrium aluminium garnet (YAG) doped with $Ce^{3+}$ is the most important example, exhibiting a strong yellow emission (at 540 nm) upon blue excitation (at 460 nm). The cubic crystal field at the Ce site associated with a small tetragonal distortion is responsible for this unusual yellow emission [2]. As demonstrated previously by Van Krevel et al. [6], it is also possible to observe green-yellow $Ce^{3+}$ emission in oxynitride compounds, by replacing oxygen by a more covalent anion such as nitrogen. Further increases of the covalent character has led to new $Eu^{2+}$ doped sialon [7,8] or silicon (oxy)nitride [9-11] based materials that have been reported to show very efficient orange luminescence. $Eu^{2+}$ doped $M_2Si_5N_8$ (where M=calcium, strontium, barium) is one of the most interesting so far [10]. The longer emission wavelength observed for nitride compounds is associated with a broader excitation band that covers part of the UV and visible spectral range.

SUMMARY OF THE INVENTION

The present invention discloses a luminescent Ce compound emitting bright red light, namely, $CaSiN_{2-\delta}O_\delta:Ce^{3+}$, which is a new phase in the calcium silicate nitride ternary system that crystallizes in a face-centered cubic unit cell with a lattice parameter of ~a=14.88 Å. This compound can be used for white light applications either: (i) to enhance the light quality of the system based on a blue LED with a yellow/green phosphor, (ii) as the orange phosphor in a blue LED+orange and green phosphor, or (iii) as the red phosphor in the UV LED plus 3 RGB phosphors setup. Since the substitution of smaller elements on the Ca site or larger elements on the Si site leads to a decrease of the emission wavelength towards the yellow/orange region, this compound may also be used directly as the yellow phosphor with a blue LED. In this regard, the present invention encompasses a number of different embodiments, which are set forth below.

In one embodiment, the present invention is an apparatus for solid state lighting applications, comprising an LED; and a luminescent Ce compound, positioned adjacent the LED, that emits orange to red light when excited by radiation from the LED. The various combinations of the LED and luminescent Ce compound may comprise: (1) a blue LED where the luminescent Ce compound is used in combination with a yellow or green phosphor; (2) a blue LED where the luminescent Ce compound is used as an orange phosphor in combination with a green phosphor; or (3) a UV LED where the luminescent Ce compound is used as a red phosphor in a group of RGB phosphors.

The luminescent Ce compound is described by the formula:

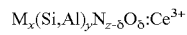

wherein x≈y≈1, z=2, 0≤δ<2 and M is calcium (Ca), magnesium (Mg), strontium (Sr) or barium (Ba). In one alternative embodiment, germanium (Ge) may be substituted for silicon (Si). In another alternative embodiment, M is yttrium (Y) or lanthanide (Ln) elements, and Si is replaced by aluminum (Al) or gallium (Ga) for charge compensation.

The luminescent Ce compound may be made using the following steps:

(a) mixing stoichiometric amounts of: (1) $Ca_3N_2$ or Ca metal, (2) AlN, (3) $Si_3N_4$ $Si_2N_2NH$, or $Si(NH)_2$, and (4) Ce, which is a rare earth source, either as a metal, a nitride, or an oxide, in order to form a mixture;

(b) weighting and grinding the mixture in conditions of $[O_2]$<1 parts per million (ppm) and $[H_2O]$<1 ppm in order to prevent oxidation or hydrolysis; and (c) loading the mixture into $Al_2O_3$ or BN crucibles for heating under flowing $N_2$ in conditions of 0.5 to 4 liters per minute to a temperature between 1300° C. and 1500° C.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Technical Disclosure

Figure 1A:
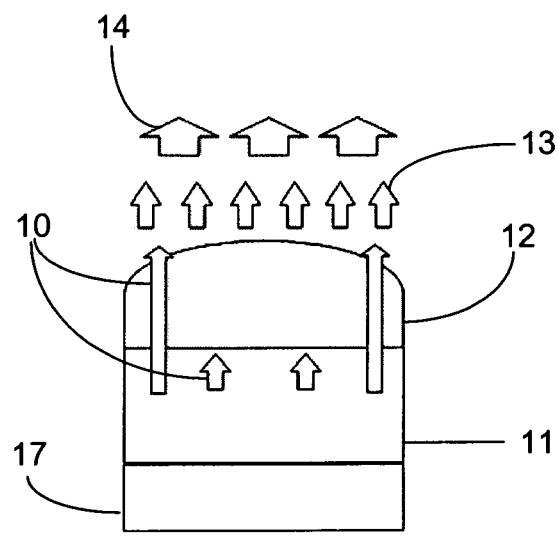
FIGS. 1(a) and 1(b) are schematic representations of a white LED setup based on a blue LED (~460 nm) with either yellow phosphor, as shown in FIG. 1 (a), or a blend of orange and green phosphor, as shown in FIG. 1 (b).
Figure 1B:
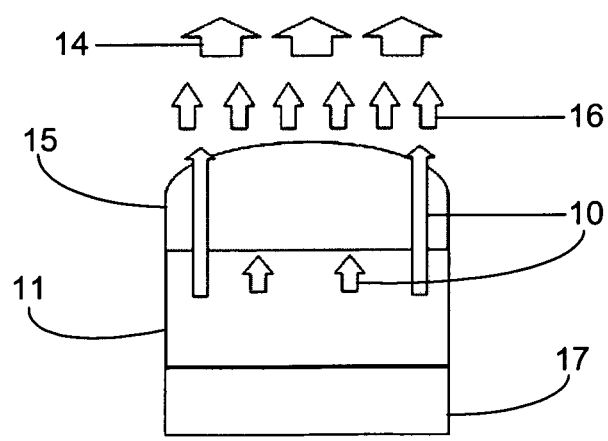
Figure 2:
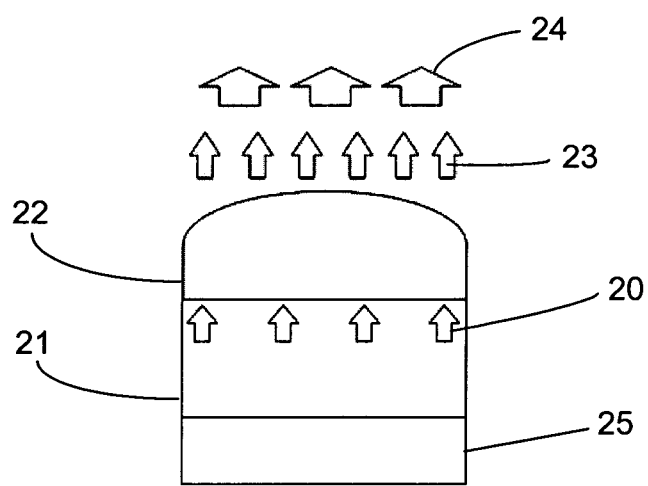
FIG. 2 is a schematic representation of the white LED setup based on a UV LED (~380 nm) with three phosphor materials, namely blue, green and red.

The subject of the present invention is the discovery of new phosphor materials for applications in white solid-state lighting based upon blue or UV LEDs. Hence, the invention covers the synthesis of an orange to red emitting material and its application as a phosphor alone or in combination with others for white LED realization, for example, in the manner shown in FIGS. 1 and 2.

The present invention covers a composition of matter comprising a luminescent Ce compound that emits orange to red light when excited by radiation and absorbs wavelengths ranging from UV to green or yellow.

This composition of matter can be described by the formula:

wherein x≈y≈1, z=2 and 0≤δ<2. M is mainly calcium (Ca), but chemical substitution on the M site is possible with different alkaline earths, such as magnesium (Mg), strontium (Sr), and barium (Ba), as shown in Table 3 below. Table 3 also shows how substantial shifts of the emission wavelength of about 50 nm have been observed upon substitution into the M site, illustrating how the luminescent Ce compound emits orange to red light when excited by radiation. Silicon (Si) atoms may also be substituted by germanium (Ge) atoms. Yttrium (Y) or lanthanide (Ln) elements may be substituted on the M site with simultaneous replacement of Si by aluminium (Al) or gallium (Ga) atoms for charge compensation. Table 3 also shows how the compound may absorb or be excited by UV to green light.

Figure 3:
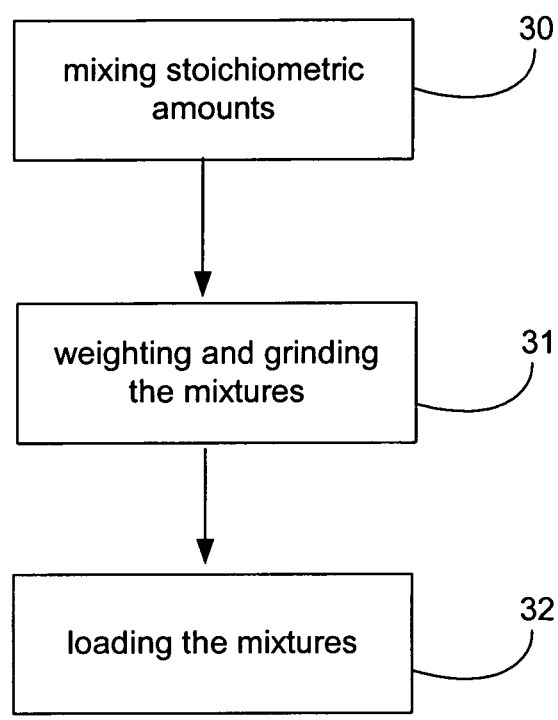
FIG. 3 is a flowchart illustrating the method of fabricating a luminescent rare earth doped compound.

FIG. 3 is a flowchart illustrating how these materials can be prepared.

Block 30 represents the step of mixing stoichiometric amounts of: (1) $Ca_3N_2$ or Ca metal, (2) AlN, (3) $Si_3N_4$, $Si_2N_2NH$ or $Si(NH)_2$, and (4) a rare earth source, such as Ce, that is either a metal, a nitride, if available, or an oxide, in order to form a mixture. This step may comprise introducing an element with a larger ionic radius, such as a rare earth, on the Ca crystallographic site, and/or by the presence of vacancies or oxygen substitution in the anion sublattice.

Block 31 represents the step of weighing and grinding the mixture, which must be carried out in a glove box ($[O_2]$<1 parts per million (ppm) and $[H_2O]$<1 ppm) in order to prevent degradation such as oxidation or hydrolysis.

Block 32 represents the step of loading the mixture in, for example, sapphire ($Al_2O_3$) or boron nitride (BN) crucibles to be heated in a tube furnace under flowing nitrogen ($N_2$) at 0.5 to 4 liters per minute to a temperature between 1300° C. and 1500° C.

All samples have been characterized using X-ray diffraction, $^{29}Si$ NMR spectroscopy and UV/visible emission excitation spectroscopy.

Figure 4:
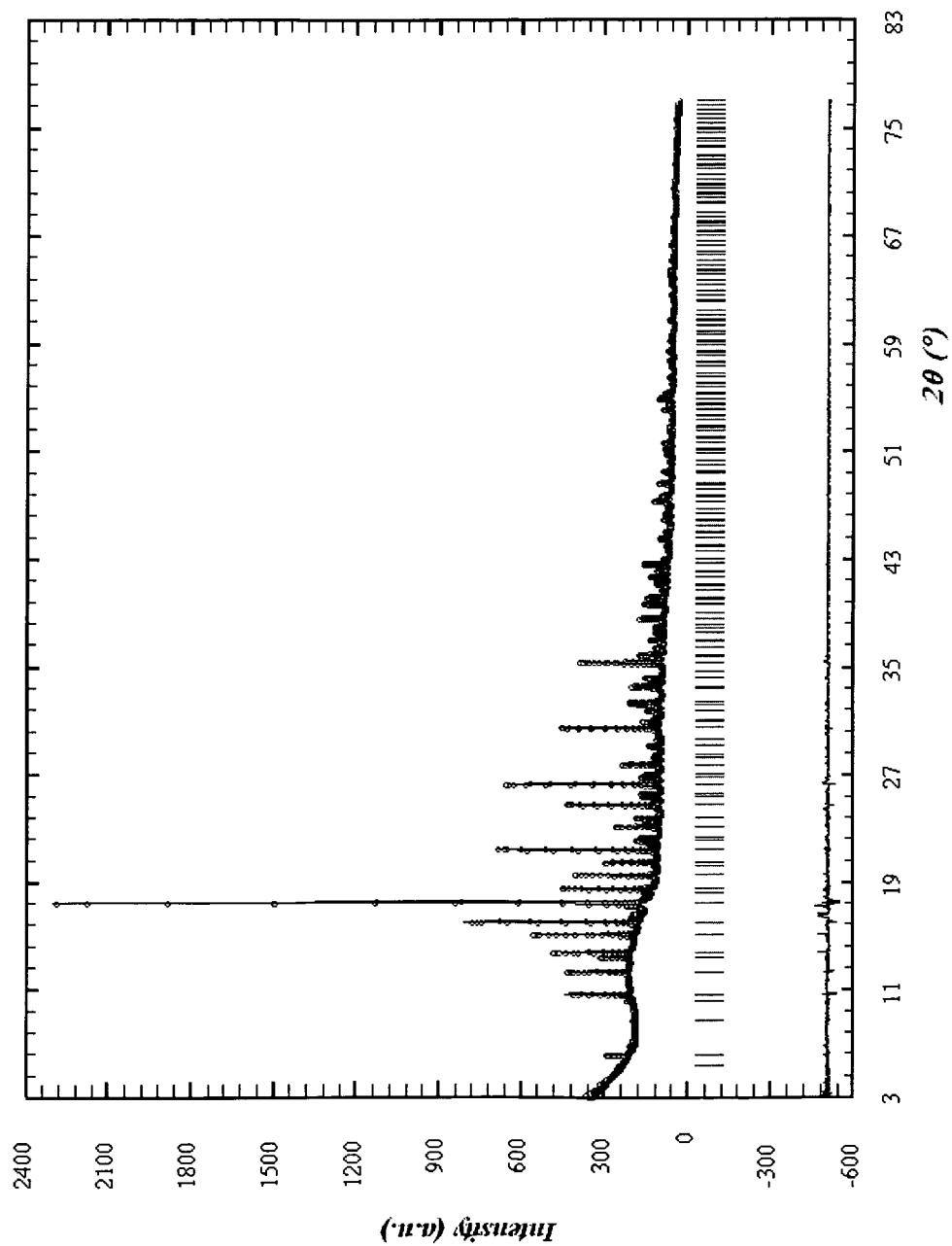
FIG. 4 is a graph of a synchrotron X-ray diffraction pattern of the phase $CaSiN_{2-\delta}O_\delta$ doped with $Ce^{3+}$, with Le Bail refinement in the space group F23 with unit cell parameter a=14.8822(5) Å.

A $CaSiN_2$ phase has already been reported to crystallize with an orthorhombic symmetry (space group Pnma) and cell parameters $a_o$=5.1229 Å, $b_o$=10.2074 Å and $c_o$=14.8233 Å[12-14]. Synchrotron X-ray diffraction experiments have been used to characterize the new phase in the calcium silicate nitride ternary system ($CaSiN_2$), as shown in FIG. 4. The $CaSiN_2$-related phase presented herein has a cubic symmetry with possible space group F23, and a refined cell parameter of ~α=14.88 Å. This phase can be related to the one reported in the literature according to the relations $a_c$=2√2$a_o$, $a_c$=√2$a_o$, $a_c$=$c_o$. The new phase reported here can only be obtained by the introduction of an element with a larger ionic radius, such as a rare earth, on the Ca crystallographic site, and/or by the presence of vacancies or oxygen substitution in the anion sublattice (i.e., by selecting δ and the nitrogen concentration).

Substitution of smaller elements on the Ca site or larger elements on the Si site of the $CaSiN_{2-\delta}O_\delta:Ce^{3+}$ compound leads to a decrease of the emission wavelength towards the yellow/orange spectral region.

Figure 5A:
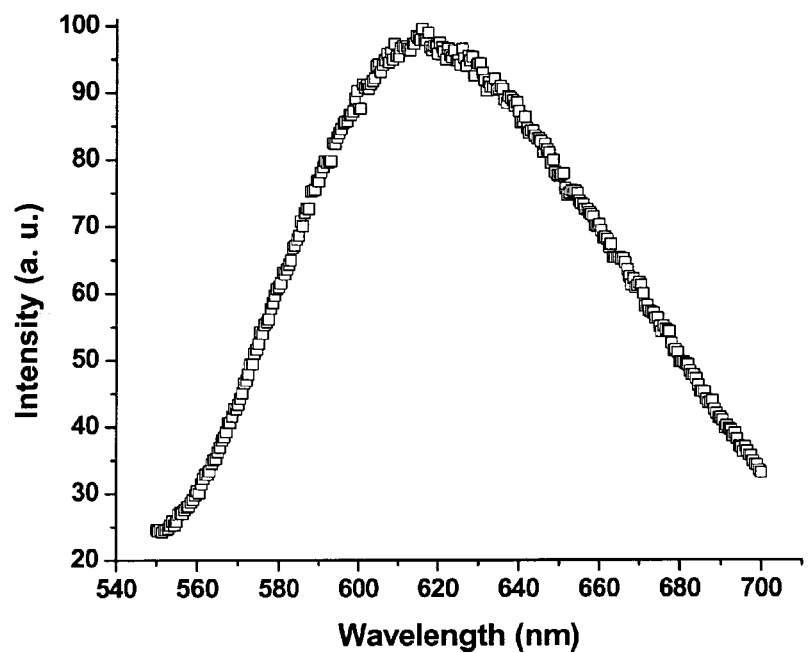
FIG. 5(a) is a graph of an emission spectrum of the compound $CaSiN_2$ doped with $Ce^{3+}$, wherein the excitation wavelength is 535 nm.
Figure 5B:
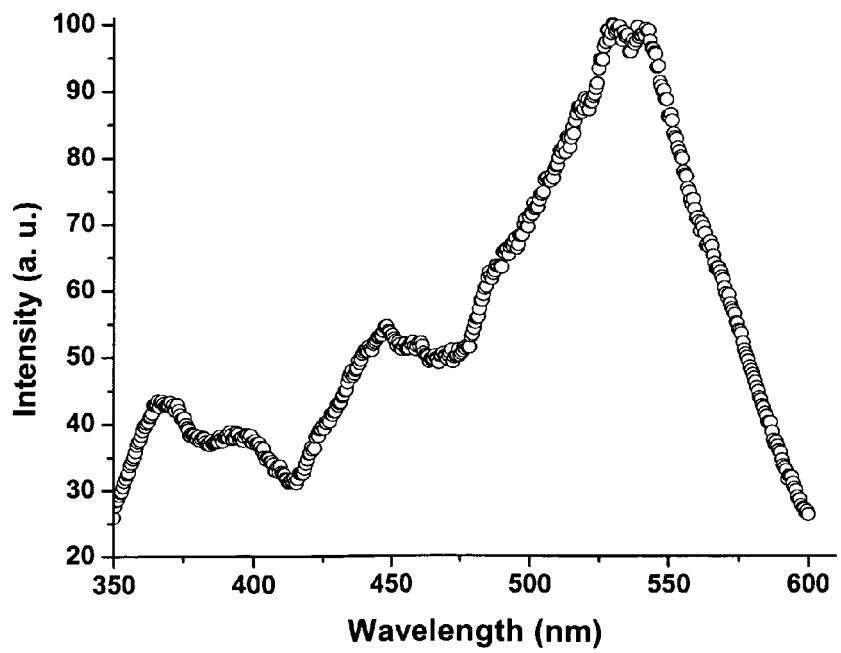
FIG. 5(b) is a graph of an excitation spectrum of the compound $CaSiN_2$ doped with $Ce^{3+}$, wherein the emission wavelength has been fixed at 630 nm.
Figure 6A:
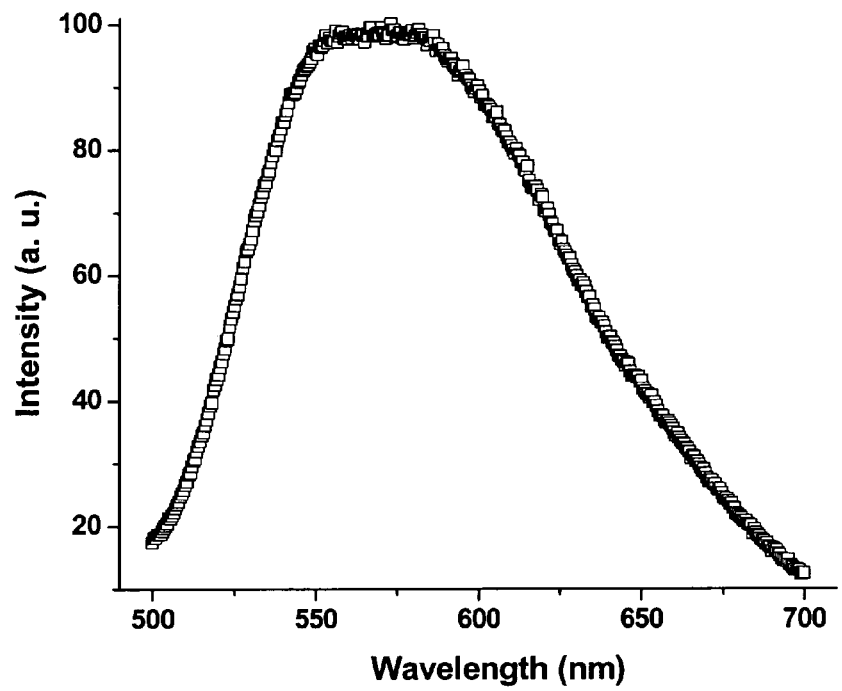
FIG. 6(a) is a graph of an emission spectrum of the compound $Ca(Si,Al)N_2$ doped with $Ce^{3+}$, wherein the excitation wavelength is 475 nm.
Figure 6B:
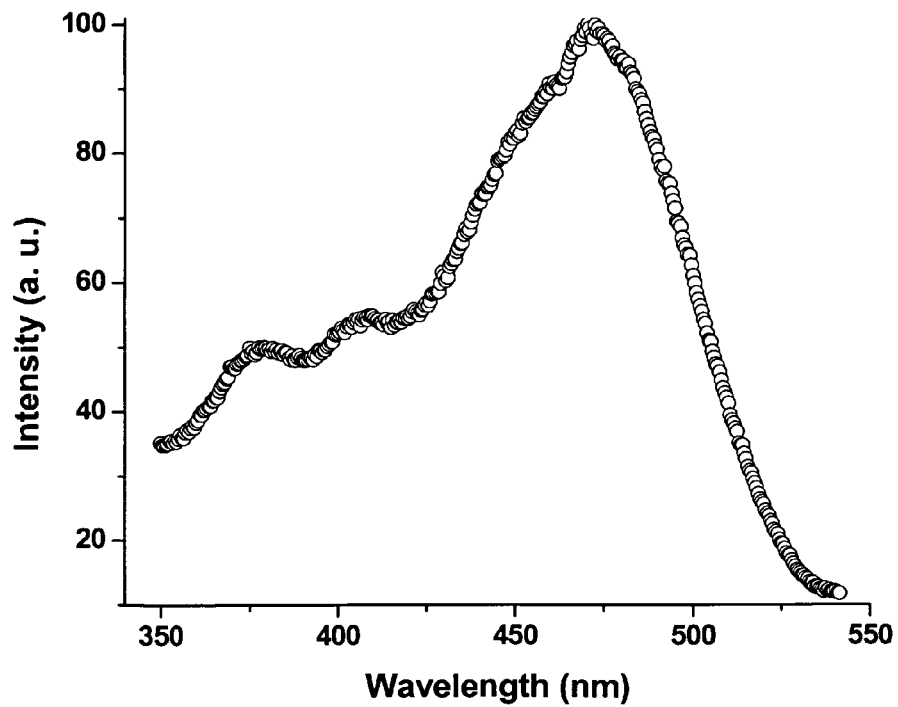
FIG. 6(b) is a graph of an excitation spectrum of the compound $Ca(Si,Al)N_2$ doped with $Ce^{3+}$, wherein the emission wavelength has been fixed at 560 nm.

FIGS. 5(a) and 6(a) are further examples of the luminescent Ce compound emitting orange to red light, and FIGS. 5(b) and 6(b) are further examples of the luminescent Ce compound that has an excitation spectrum or band comprising wavelengths in the range UV to yellow.

The compound $CaSiN_{2-\delta}O_\delta:Ce^{3+}$ has several important properties. First, it represents the first $Ce^{3+}$ phosphor materials showing an intense red emission (peaking at ~620 nm), as shown in FIG. 5(a). It is also one of the rare phosphors that can be excited in the yellow and green region as well as in the blue and ultraviolet, as illustrated in FIGS. 5(b) and 6(b). The red emission can be used to compensate the bluish tint of the YAG and blue LED setup by its addition as a second phosphor that converts green light into red, as shown by FIG. 5(b). Second, the green to red transition may be useful for the enhancement of plant growth by photosynthesis. Third, the tunable emission of this phosphor (see Table 3 below) makes it also very interesting as a yellow or orange phosphor by itself, as shown in FIG. 6(a), or in combination with a green emitting phosphor, which can be excited at 460 nm (with a blue LED for example), as shown in FIG. 6(b). Substitution on the Ca and Si sites leads to emission covering the visible spectra from 450 nm up to 700 nm with maxima between 500 nm and 650 nm. The excitation bands can also been tuned between 400 and 600 nm. As expected, these compounds show emission/excitation peak shapes (or spectra) that are typical of cerium compounds, with relatively broad peaks, as shown in FIGS. 5(a), 5(b), 6(a) and 6(b). The emission spectrum in FIGS. 5(a) and 6(a) may have a Full Width at Half Maximum (FWHM) of ~90 nm and comprises the entire spectrum of wavelengths associated with orange and red light. The excitation spectrum in FIGS. 5(b) and 6(b) may have a FWHM of 60 nm. These broad emission and excitation features lead to advantageous color rendering properties.

These new phosphors may also be interesting as yellow or red phosphors in a group comprising three phosphors (red, green and blue), used with a UV LED for the design of solid-state lighting, since the luminescent Ce compounds can be excited in the UV (~380 nm) using GaN or ZnO based LEDs, as shown in FIGS. 5(b) and 6(b).

Figure 7:
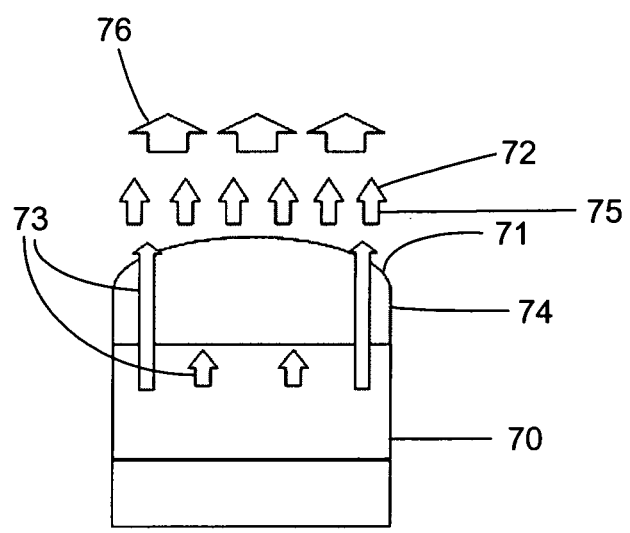
FIG. 7 is a schematic representation of an apparatus for solid state lighting applications, comprising an LED and a luminescent Ce compound, positioned adjacent the LED.

FIG. 7 is a schematic representation of an apparatus for solid state lighting applications, comprising an LED (70) and a composition of matter comprising a luminescent Ce compound (71), wherein the luminescent Ce compound is positioned adjacent the LED (70), and the luminescent Ce compound emits orange to red light (72) when excited by radiation (73) from the LED.

The luminescent Ce compound may be used in combination with one or more other phosphors (74). For example, when the LED (70) is a blue LED, the luminescent Ce compound (71) may be used with the blue LED in combination with at other phosphors (74) such as a yellow or green phosphors. Alternatively, when the LED (70) is a blue LED, the luminescent Ce compound (71) may be used with the blue LED as an orange phosphor in combination with other phosphors (74) such as a green phosphor. Also, when the LED (70) is an UV LED, the luminescent Ce compound may be used with the UV LED as a red phosphor in a group of RGB phosphors (74). The combination of radiation (73) from the LED (70) and light (75) emitted by the luminescent Ce compound in combination with the other phosphor (74) may appear as white light (76).

Other rare earths other than Ce may also be introduced or doped into the new phase of the calcium silicate nitride system, in order to form a luminescent compound or phosphor. The same cubic symmetry remains and a typical decrease of the unit cell parameter is observed along the rare earth series (see Table 1 below). The optical properties of these materials are also interesting in terms of phosphor applications (see Table 2 below). Thus, the apparatus of FIG. 7 may utilize a luminescent compound (71) from the calcium silicate nitride ternary system having cubic symmetry (such as face center cubic), and doped with other rare earths.

REFERENCES

The following references are incorporated by reference herein:

[1] S. Nakamura, G. Fasol, The Blue Laser Diode: GaN Based Light Emitters and Lasers, Springer, Berlin (1997).
[2] G. Blasse and A. Brill, Appl. Phys. Lett., 11 (1967): J. Chem. Phys., 47 (1967) 5139.
[3] U.S. Pat. No. 5,998,925, to Y. Shimizu. et al., issued Dec. 7, 1999, and entitled "Light emitting device having a nitride compound semiconductor and a phosphor containing a garnet fluorescent material."
[4] T. Justel, H. Nikol, C. Ronda, Angew. Chem. Int. Ed., 1998, 37, 3084-3103.
[5] G. Blasse, B. C. Grabmeier, Luminescent Materials, Springer, Berlin (1994).
[6] J. W. H. van Krevel, H. T. Hintzen, R. Metselaar, A. Meijerink, J. Alloys Compd. 268 (1-2), 272-277 (1998).
[7] U.S. Pat. No. 6,717,353, to G. O. Mueller et al., issued Apr. 6, 2004, and entitled "Phosphor converted light emitting device."
[8] J. W. H. van Krevel, J. W. T. van Rutten, H. Mandal, H. T. Hinzen, R. Metselaar, J. Solid State Chem. 165 (1) 19-24 (2002).
[9] U.S. Pat. No. 6,670,748, to A. Ellens et al., issued Dec. 30, 2003, and entitled "Illumination unit having at least one LED as light source."
[10] U.S. Pat. No. 6,682,663, to G. Botty et al., issued January 2004, and entitled "Pigment with day light fluorescence."
[11] U.S. Pat. Publication No. 20030006702, by R. B. Mueller-Mach et al., published Jan. 9, 2003, and entitled "Red deficiency compensating phosphor light emitting device."
[12] Z. A. Gal, P. M. Mallinson, H. J. Orchard, S. J. Clarke. Inorg. Chem. 2004, 43, 3998-4006.
[13] S. S. Lee, S. Lim, S. S. Sun, J. F. Wagner. Proc. SPIE Int. Soc. Opt. Eng. 3241, 1997, pp. 75-79.
[14] E. A. Pugar, J. H. Kennedy, P. D. Morgan, J. H. Porter, J. Am. Ceram. Soc. 71 [6] C-288 (1988).
[15] S. P. Den Baars, in Solid State Luminescence Theory, Materials and Devices, edited by A. H. Kitai, Chapman and Hall, London (1993).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching without fundamentally deviating from the essence of the present invention. It is intended that the scope of the invention be limited not by this detailed description, but rather by the claims appended hereto.

TABLE 1

Cubic unit cell parameters for different rare earth ions (RE) doped on Ca site with the same percentage - the refinement has been carried out in the space group F23.

| $Ca_{1-x}RE_xSiN_2$ | RE = $Ce^{3+}$ | RE = $Pr^{3+}$ | RE = $Sm^{3+}$ | RE = $Eu^{2+}$ | RE = $Tb^{3+}$ | RE = $Er^{3+}$ |
|---|---|---|---|---|---|---|
| Cubic unit cell parameter | 14.8822 Å | 14.8720 Å | 14.8463 Å | 14.8419 Å | 14.8587 Å | 14.8517 Å |

TABLE 2

Optical properties of $CaSiN_2$ doped with several rare earth ions (RE) - for line emitter rare earth, only the strongest peak is presented.

| $Ca_{1-x}RE_xSiN_2$ | RE = $Ce^{3+}$ | RE = $Pr^{3+}$ | RE = $Sm^{3+}$ | RE = $Eu^{2+}$ | RE = $Tb^{3+}$ | RE = $Er^{3+}$ |
|---|---|---|---|---|---|---|
| Body color | pink/red | white | white | orange | white | grey |
| Wavelength (λ) emission maximum (nm) | 630 | 425 | 610 | 605 | 550 | 420 |
| Wavelength (λ) excitation maximum (nm) | 535 | 330 | 400 | 400 | 275 | 325 |

TABLE 3

Optical properties of $Ce^{3+}$ doped $CaSiN_2$ substituted with different cations on the Ca and Si site

| $Ce^{3+}$ doped compound | Emission wavelength maximum (nanometers) | Excitation Wavelength maximum (nanometers) | Body color |
|---|---|---|---|
| $CaSiN_2$ | 630 | 535 | pink/red |
| $Ca(Al, Si)N_2$ | 560 | 475 | orange |
| $(Ca, Sr)SiN_2$ | 640 | 500 | orange |
| $(Ca, Mg)SiN_2$ | 540 | 460 | yellow |

What is claimed is:

1. An apparatus for solid state lighting applications, comprising:
   a light emitting diode (LED); and
   a luminescent cerium (Ce) compound including Calcium (Ca), Silicon (Si), Nitrogen, $Ce^{3+}$ doping, and a cubic unit cell, wherein the luminescent Ce compound emits orange to red light when the luminescent Ce compound is excited by radiation from the light emitting diode.

2. The apparatus of claim 1, wherein the light emitting diode is a blue light emitting diode and the luminescent Ce compound is adjacent the blue light emitting diode in combination with a yellow or green phosphor.

3. The apparatus of claim 1, wherein the light emitting diode is a blue light emitting diode and the luminescent Ce compound is adjacent the blue light emitting diode as an orange phosphor in combination with a green phosphor.

4. The apparatus of claim 1, wherein the light emitting diode is an ultraviolet (UV) light emitting diode and the luminescent Ce compound is adjacent the ultraviolet light emitting diode as a red phosphor in a group of red, green and blue (RGB) phosphors.

5. A composition of matter, comprising:
   a luminescent cerium (Ce) compound including Calcium (Ca), Silicon (Si), Nitrogen, $Ce^{3+}$ doping, and a cubic unit cell, wherein the luminescent Ce compound emits orange to red light when the luminescent Ce compound is excited by radiation having one or more wavelengths in a range from ultraviolet (UV) to green wavelengths.

6. The composition of matter of claim 5, wherein the luminescent Ce compound is excited by the radiation that is ultraviolet (UV) radiation.

7. The composition of matter of claim 5, wherein the luminescent Ce compound is described by the formula:

$$M_xB_yN_{z-\delta}O_{\delta:Ce^{3+}}$$

wherein x≈y≈1, z=2, 0≥δ<2 and M includes the calcium (Ca), B includes the Si, and N includes the Nitrogen.

8. The composition of matter of claim 5, further comprising at least one additional element on the site of the Ca.

9. The composition of matter of claim 5, further comprising Strontium (Sr) on a site of the Ca.

10. The composition of matter of claim 5, wherein the luminescent Ce compound's formula comprises $CaSiN_{2-\delta}O_\delta$:$Ce^{3+}$ with 0≤δ<2.

11. The composition of matter of claim 5, further comprising one or more additional elements on a site of the Si.

12. A method for creating a luminescent compound, comprising the steps of:
   (a) mixing stoichiometric amounts of: (1) $Ca_3N_2$ or Ca metal, (2) AlN, (3) $Si_3N_4$, $Si_2N_2NH$, or $Si(NH)_2$, and (4) a rare earth source either as a metal, a nitride, or an oxide, in order to form a mixture, wherein the rare earth source is cerium (Ce);
   (b) weighing and grinding the mixture in conditions of $[O_2]$ <1 parts per million (ppm) and $[H_2O]$<1 ppm in order to prevent oxidation or hydrolysis; and
   (c) heating the mixture under flowing $N_2$ in conditions of 0.5 to 4 liters per minute to between 1300° C. and 1500° C., such that
   the luminescent compound that is created comprises Calcium (Ca), Silicon (Si), Nitrogen, $Ce^{3+}$ doping, and a cubic unit cell, wherein the luminescent compound emits orange to red light when the luminescent compound is excited by radiation including one or more wavelengths in a range from ultraviolet to green wavelengths.

13. The method of claim 12, wherein the radiation is ultraviolet (UV) radiation.

14. The method of claim 12, wherein the luminescent Ce compound has an excitation spectrum that peaks in a blue wavelength range.

15. The method of claim 13, wherein the luminescent Ce compound's formula comprises $CaSiN_{2-\delta}O_\delta:Ce^{3+}$ with $0 \leq \delta < 2$.

16. The composition of claim 5, wherein the luminescent Ce compound has an excitation spectrum that peaks in a blue wavelength range.

17. The composition of matter of claim 5, wherein the light has a peak intensity in a red wavelength range.

18. The composition of matter of claim 5, wherein the light has a peak intensity in an orange wavelength range.

19. The composition of matter of claim 5, wherein an emission spectrum of the light has a full width at half maximum that includes one or more wavelengths corresponding to orange light.

20. The composition of matter of claim 5, wherein an emission spectrum of the light has a full width at half maximum that includes one or more wavelengths corresponding to red light.

21. The composition of matter of claim 5, wherein the $Ce^{3+}$ is an emitter.

22. The composition of matter of claim 5, wherein the luminescent Ce compound has an excitation spectrum that peaks in a green wavelength range.

23. The method of claim 12, wherein the light has a peak intensity in a red wavelength range.

24. The method of claim 12, wherein the light has a peak intensity in an orange wavelength range.

25. The method of claim 12, wherein an emission spectrum of the light has a full width at half maximum that includes one or more wavelengths corresponding to orange light.

26. The method of claim 12, wherein an emission spectrum of the light has a full width at half maximum that includes one or more wavelengths corresponding to red light.

27. The method of claim 12, wherein the $Ce^{3+}$ is an emitter.

* * * * *